United States Patent
Lee

(12) 
(10) Patent No.: US 6,479,851 B1
(45) Date of Patent: Nov. 12, 2002

(54) MEMORY DEVICE WITH DIVIDED BIT-LINE ARCHITECTURE

(75) Inventor: Jae Jin Lee, Ichon-si (KR)

(73) Assignee: Hynix Semiconductor, Inc., Seoul (KR)

( * ) Notice: Subject to any disclaimer, the term of this patent is extended or adjusted under 35 U.S.C. 154(b) by 0 days.

(21) Appl. No.: 09/573,070

(22) Filed: May 16, 2000

(51) Int. Cl.[7] .......................................... H01L 27/108
(52) U.S. Cl. ........................ 257/300; 257/296; 257/260; 438/250
(58) Field of Search ................................ 257/296, 300, 257/260, 903, 908, 906; 438/250

(56) References Cited

U.S. PATENT DOCUMENTS 4,916,667 A * 4/1990 Miyabayashi et al. ...... 365/207
5,262,992 A * 11/1993 Kondou ........................ 365/190
5,732,010 A * 3/1998 Takashima et al. ........... 365/63

OTHER PUBLICATIONS

Fully–Divided Bit Line for Dynamic Random–Access Memory Sensing Circuitry, IBM Technical Disclosure Bulletin, Dec. 1988, NN8812266.*

* cited by examiner

Primary Examiner—Nathan J. Flynn
Assistant Examiner—Scott R. Wilson
(74) Attorney, Agent, or Firm—Horace H. Ng; Townsend and Townsend and Crew, LLP

(57) ABSTRACT

The present invention relates to an improved memory circuit with a divided bit-line, shared sense amplifier architecture. In a conventional divided bit-line, shared sense amplifier configuration, two adjacent memory sub-arrays are generally located between two banks of sense amplifiers and selected bit lines of the two adjacent memory sub-arrays are generally connected to metal lines with metal contacts to reduce capacitive loading. Under the present invention, some sense amplifiers from either banks of sense amplifiers are repositioned to the area between the two adjacent memory sub-arrays thereby permitting the repositioned sense amplifiers to be shared. As a result, any two adjacent memory sub-arrays share a bank of sense amplifiers. Furthermore, selected bit lines from the two adjacent memory sub-arrays are coupled to metal lines within the repositioned sense amplifiers. In addition, equilibration circuits are similarly relocated to the area between the two adjacent memory sub-arrays thereby permitting selected bit lines and metal lines to be precharged and equalized in a shorter period of time. By reducing the precharge time, faster memory access can be achieved.

36 Claims, 13 Drawing Sheets

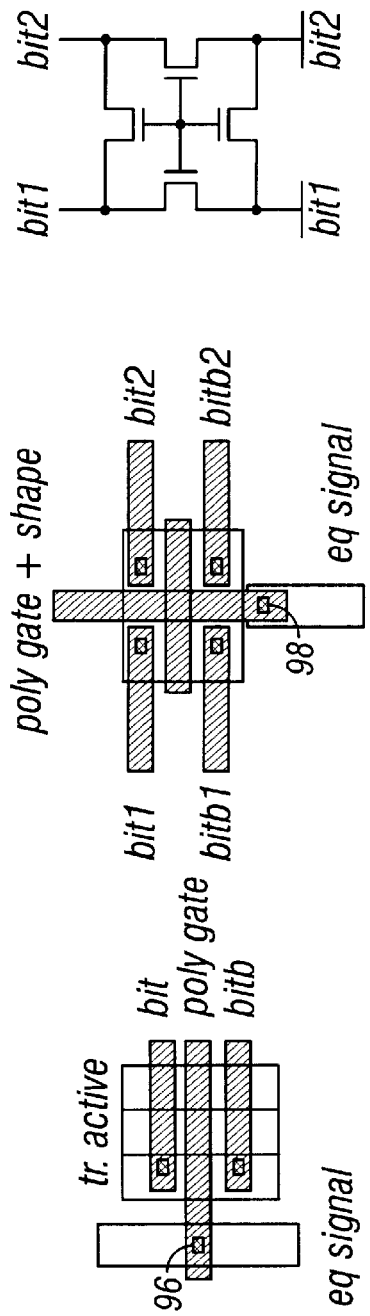
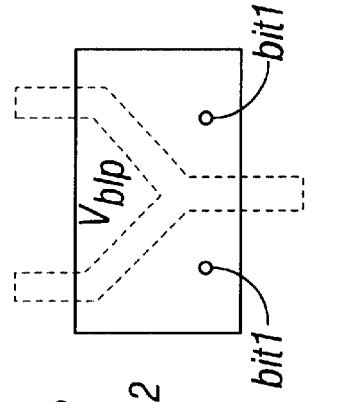
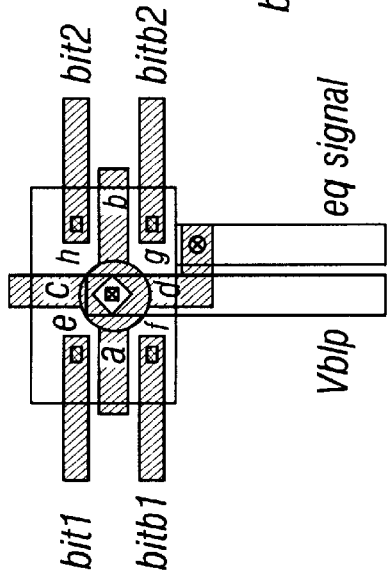
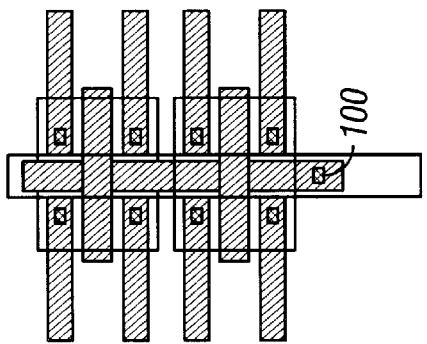
FIG. 11A  FIG. 11B  FIG. 11C
FIG. 11D  FIG. 11E  FIG. 11F

MEMORY DEVICE WITH DIVIDED BIT-LINE ARCHITECTURE

BACKGROUND OF THE INVENTION

The present invention generally relates to memory devices. More specifically, the present invention relates to memory devices with divided bit-line, shared sense amplifier architecture.

FIG. 1 is a simplified block diagram of a conventional dynamic random access memory or DRAM showing an illustrative structure of a memory cell array 10. The memory cell array 10 is made up of many unit memory cells, each of which is usually individually addressable and used to store a bit. The unit memory cell has a capacitor which holds the data in the form of electrical charges, and an access transistor which serves as a switch for selecting the capacitor. Unit memory cells are located at the intersection of word lines WLx (or rows) and bit lines BLx (or columns). The access transistor's gate is connected to the word line WLx. The source of the access transistors are connected to the bit lines BLx. Each pair of complementary bit lines is connected to a sense amplifier 12.

Memory access begins when a word line is selected (via the decoding of a row address) thereby switching on all the access transistors connected to that word line. In other words, all the unit memory cells in that particular row are turned on. As a result, charge in the capacitor within each unit memory cell is transferred onto its corresponding bit line causing a charge imbalance which leads to a potential difference between the pair of complementary bit lines. This potential difference is detected and amplified by a sense amplifier 12. This amplified potential difference is then transferred to the I/O gate activated based on the column address, which in turn transfers the amplified signal to the data output buffer.

Furthermore, the precharge/equilibration circuit 14 plays a significant role in detecting memory data during the course of a memory access operation. In advance of a memory access and the activation of a word line, the equilibration circuit 14 charges all bit line pairs up to a certain potential which usually equals to half of the supply potential, that is, Vdd/2. As shown in, for example, FIG. 1, the bit line pairs are short-circuited by a transistor so that they are each at an equal potential. The precharging and potential equalization by the equilibration circuit 14 is important due to the disparate difference in capacitance between the bit lines and the storage capacitor. Since the capacitance of the storage capacitor is far less than that of the bit lines, when the storage capacitor is connected to the bit lines via the access transistor, the potential of the bit line changes only slightly, typically by 100 mV. If the storage capacitor was empty, then the potential of the bit line slightly decreases; if charged, then the potential increases. The activated sense amplifier amplifies the potential difference on the two bit lines of the pair. In the first case, it draws the potential of the bit line connected to the storage capacitor down to ground and raises the potential of the other bit line up to Vdd. In the second case, the bit line connected to the storage capacitor is raised to Vdd and the other bit line decreased to ground.

Each bit line BLx can be viewed as a column. The width between a pair of complementary bit lines, e.g., BLx and its complement $\overline{BLx}$, is commonly known as the bit-line pitch or two-column pitch. As can be seen from FIG. 1, the physical width of each sense amplifier 12 is roughly the same as the two-column pitch, i.e., the width between the pair of complementary bit lines. With the rapid development of semiconductor fabrication techniques, the unit memory cell and thus the two-column pitch is increasingly becoming smaller and smaller. Consequently, with the smaller dimensions, the density of bit lines within the same unit area is also increased. This increase in bit-line density, however, cannot be fully exploited if the size and physical shape of the sense amplifiers 12 remains the same. As FIG. 1 shows, since the sense amplifiers 12 are lined up in a row, the size of the sense amplifiers 12 has to correspondingly decrease to realize the full benefit of the narrower two-column pitch. Therefore, it would be desirable to provide a method and apparatus for reducing the size of sense amplifiers so as to take advantage of the narrower two-column pitch of complementary pairs of bit lines.

FIG. 2 shows half of a sense amplifier circuit commonly used in memory circuits to detect potential difference between bit line pairs. The source of the transistors N20, N30 are connected together at a predetermined bit line potential. The gate of one transistor is connected to the drain of the other transistor.

In accordance with conventional methods, as the two-column pitch between the bit line pairs becomes smaller, the sense amplifiers have to be correspondingly laid out in a long and narrow manner to match the narrower column pitch.

FIG. 3 shows a conventional fabrication layout for the sense amplifier circuit shown in FIG. 2 laid out in the longer and narrower shape to fit the smaller two-column pitch. As shown in FIG. 3, the source, drain, and gate areas of the two cross-coupled transistors N20, N30 are laid out in parallel to the bit lines. Note that in this example, first layer poly (poly 1) is used for transistor gate terminals and second layer poly (poly 2) is used for bit lines. When laid out in this manner, however, the sense amplifier makes very inefficient use of the surface area. A more compact layout, as described below, is much preferred in order to maximize the use of the surface area.

FIG. 4 shows an alternate fabrication layout for the sense amplifier circuit shown in FIG. 2 wherein the transistors are laid out at right angle to the bit lines. The right-angle configuration of FIG. 4 clearly requires less surface area than that shown in FIG. 3. For example, unlike the layout configuration of FIG. 3, this layout configuration allows the common source regions of the two transistors to be shared in one active area 16, thereby saving the area that would otherwise have been needed for an additional, physically separate source region. Further, under the right-angle configuration, the contacts 18 for the connections between the gate and the bit lines and between the drain and the bit lines can fit within the active areas, therefore, obviating the need to have additional space to accommodate the contacts. While the right-angle layout generally conserves total surface area, such layout, however, requires a wider two-column pitch as shown. It, therefore, cannot be used unless the two-column pitch requirements are relaxed.

With the use of three-layer metal in semiconductor fabrication processes, a divided bit-line, shared sense amplifier configuration is made possible. FIG. 5 shows a conventional DRAM memory circuit with a divided bit-line, shared sense amplifier architecture. The sense amplifiers are arranged in banks 20, 30 and each sense amplifier, for example, sense amplifier 30a, is shared between adjacent memory arrays 40, 50 and is connected to a pair of complementary bit lines 22, 24 from each memory array 40 or 50. A block select circuit is located on each side of a shared sense amplifier 30a. The block select circuit, which includes transistors N1, N2, N3 and N4, is controlled by block selection signals 26, 28 and is used to control the connection between the sense amplifier 30a and the pair of complementary bit lines 22, 24 from an adjacent memory array 40 or 50. The use of the block select circuits on both sides of a bank 30 of sense amplifiers allows the sense amplifiers to be shared between adjacent memory arrays 40, 50 and also ensures that only one of the two adjacent memory arrays 40, 50 can use the bank 30 of sense amplifiers on an exclusive basis at all times.

As illustrated in FIG. 5, for example, an adjacent memory array 40 is further made up of two memory sub-arrays 40a, 40b. To reduce capacitive loading of the bit lines in a given memory array 40, poly bit lines from the two memory sub-arrays 40a, 40b are not connected together. Instead, each poly bit line, for example, poly bit line 22 to be coupled to a sense amplifier 30a is generally divided into two independent segments 22a, 22b. The first segment 22a is located in the memory sub-array 40a closest to the sense amplifier 30a and is coupled to the sense amplifier 30a. The second segment 22b is located in the memory sub-array 40b farther away from the sense amplifier 30a and is coupled to a metal line 22m. The metal line 22m, in turn, is coupled to the sense amplifier 30a. As a result of the coupling between the second segment 22b and the metal line 22m, there is a bit-line metal-to-poly contact area 32 located between the two memory sub-arrays 40a, 40b. While it is preferable that the bit-line metal-to-poly contact area 32 is located generally at the midpoint of a memory array 40, such location is by no means a requirement and can be situated at any point within the boundary of the memory array 40. By coupling the second segment 22b to the metal line 22m, the capacitive loading of the second segment 22b is much reduced. The operation of this conventional DRAM memory circuit as shown in FIG. 5 is commonly understood by a person of ordinary skill in the art. Exemplary dimensions (in microns) for various circuit blocks in the device are also shown in FIG. 5. For example, each memory sub-array 40a, 40b is 200 $\mu$ wide separated by a 5 $\mu$ wide bit-line metal-to-poly contact area 32.

Moreover, under conventional bit-line designs, as shown in FIG. 1, the equilibration circuit 14 is generally located at the beginning of the bit lines. As the bit lines become longer and longer, especially in the case of a divided bit-line configuration, the time it takes to precharge an entire bit line from beginning to end proportionally increases, thereby creating unnecessary delay between memory accesses. Therefore, it would be desirable to provide a method and apparatus for optimally positioning a precharge/ equilibration circuit so as to reduce the precharging time of bit lines.

Further, it would be desirable to provide a more efficient fabrication layout for the equilibration circuit 14 so as to minimize the amount of area needed to implement such circuit on a chip.

SUMMARY OF THE INVENTION

The present invention relates to an improved memory circuit with a divided bit-line, shared sense amplifier architecture. In a conventional divided bit-line configuration, segments of poly bit lines are generally coupled to metal lines via a bit-line metal-to-poly contact area to reduce capacitive loading. In one embodiment of the present invention, a number, for example, half, of the sense amplifiers from a given bank are physically relocated to the bit-line metal-to-poly contact area inside the memory array. This relocation frees up silicon area for the sense amplifiers, allowing each sense amplifier to be laid out in, for example, a right-angle configuration.

Furthermore, selected bit lines from two adjacent memory sub-arrays are coupled to metal lines within the relocated sense amplifiers. In addition, equilibration circuits are similarly relocated to the area between the two adjacent memory sub-arrays thereby permitting selected bit lines and metal lines to be precharged and equalized in a shorter period of time. By reducing the precharge time, faster memory access can be achieved.

In addition, various layout structures for the equilibration circuits are presented to maximize the use of silicon area on a chip.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings. In the drawings, like reference numbers indicate identical or functionally similar elements and letters at the end of reference numbers are used for ease of reference to further differentiate each of a number of identical or functionally similar elements.

BRIEF DESCRIPTION OF THE DRAWINGS

FIG. 11a is a layout diagram for a conventional one-transistor equilibration circuit; and FIGS. 11b–f are improved layout diagrams for various equilibration circuits in accordance with the present invention.

DESCRIPTION OF THE SPECIFIC EMBODIMENTS

Figure 5A:
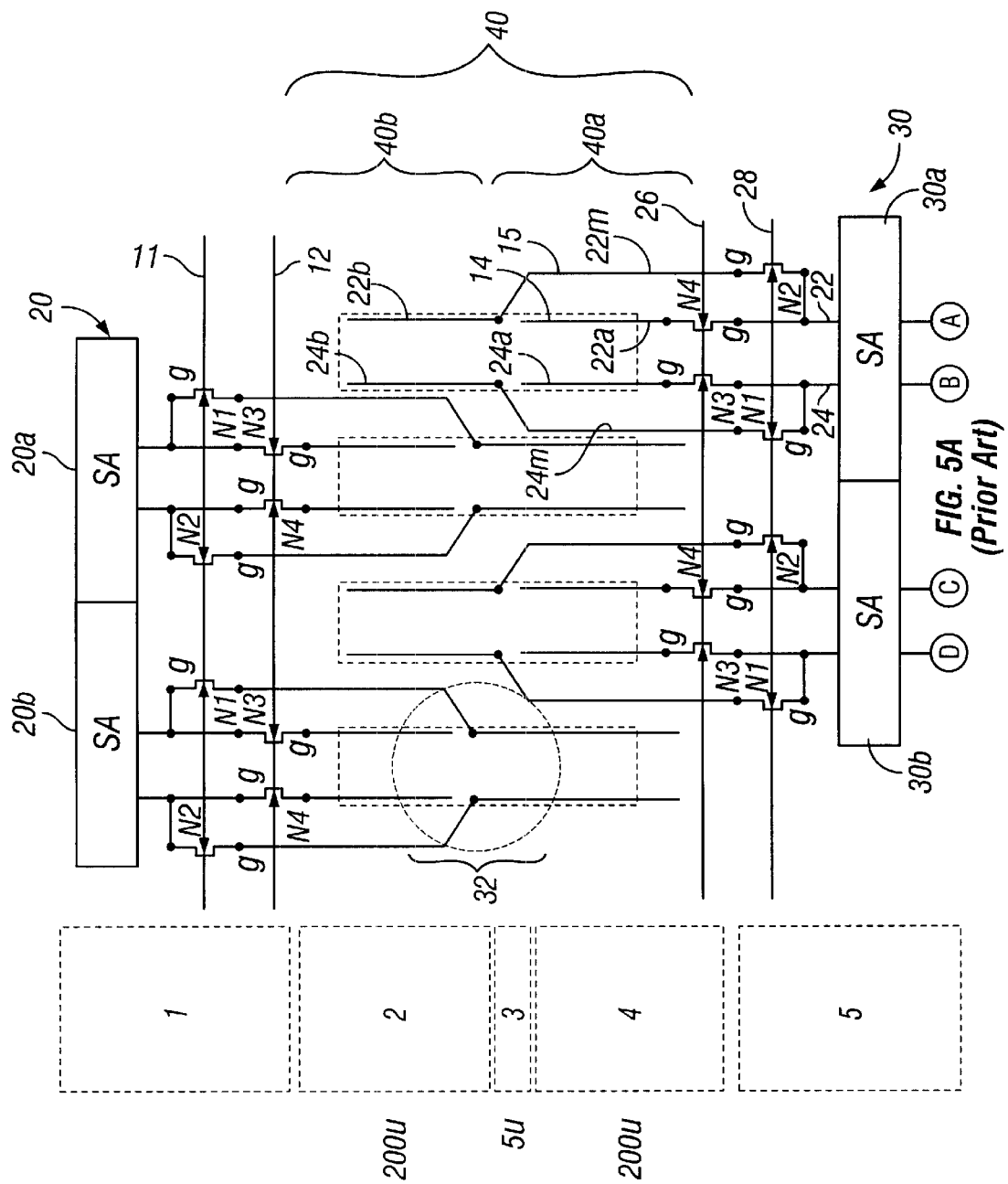
FIG. 5 shows a conventional memory circuit having a divided bit-line, shared sense amplifier configuration.
Figure 5B:
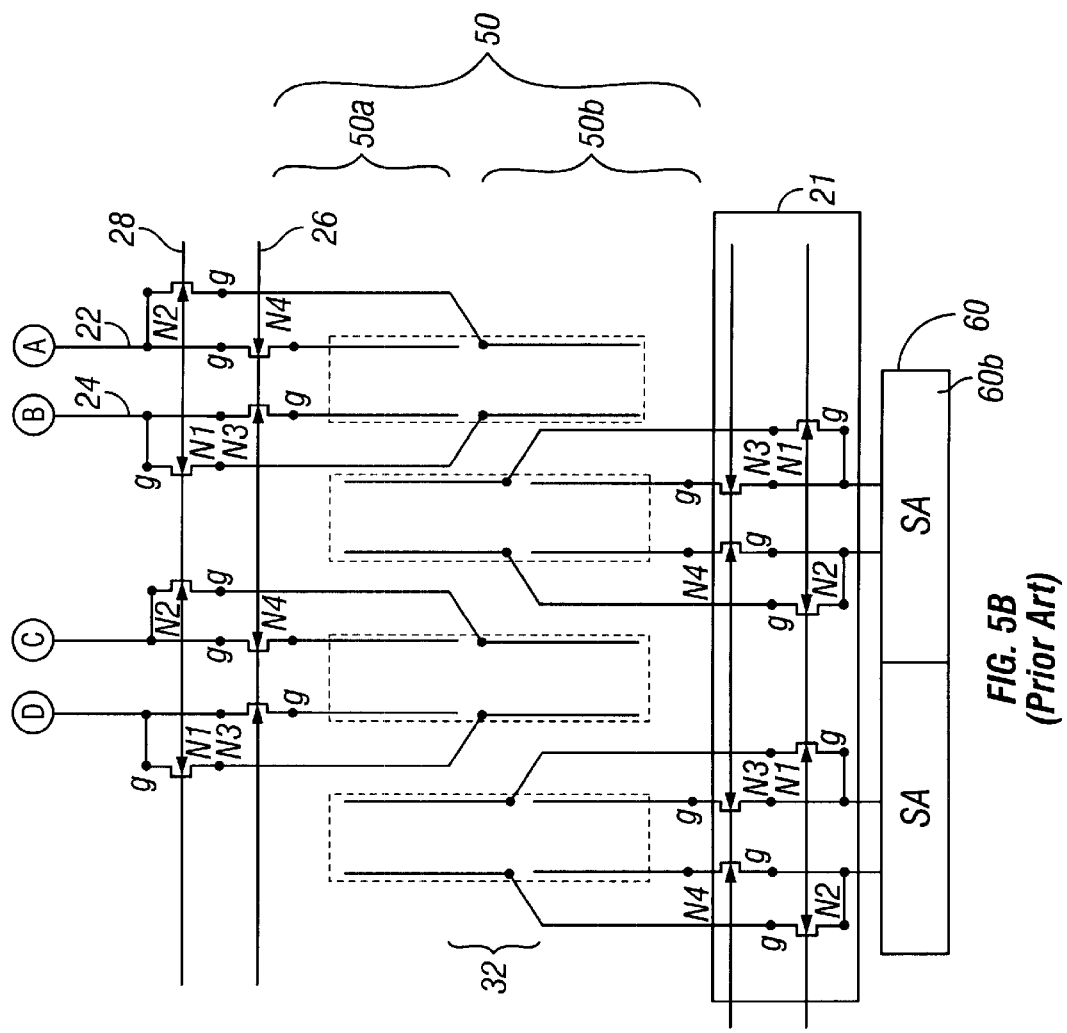
Figure 6A:
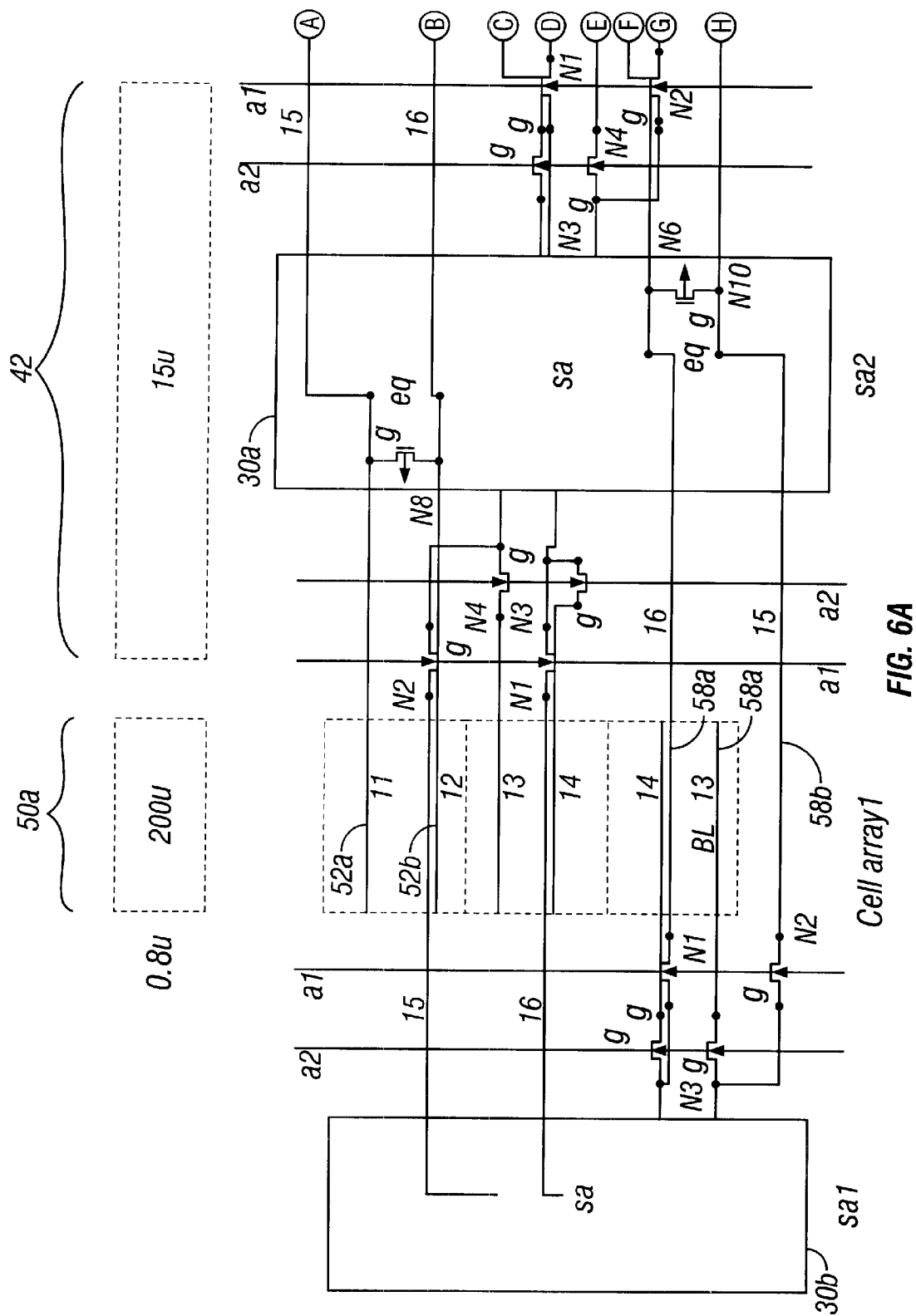
FIG. 6 is a schematic diagram showing one embodiment of a DRAM memory circuit in accordance with the present invention.
Figure 6B:
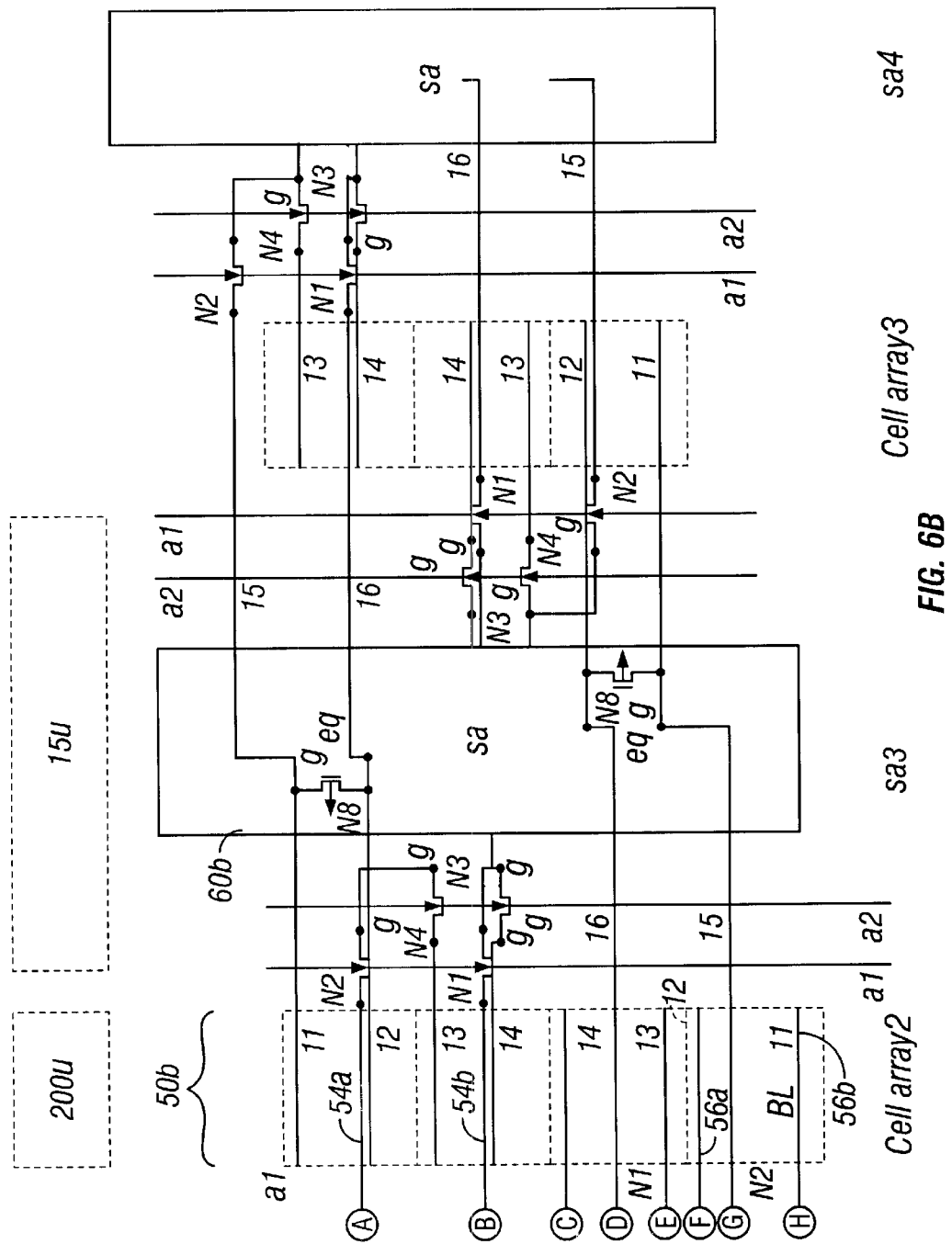

The present invention seeks to provide a more compact DRAM memory circuit having a divided bit-line, shared sense amplifier architecture. FIG. 6 is a schematic diagram showing one embodiment of a DRAM memory circuit in accordance with the present invention that allows the use of the wider but more compact right-angle sense amplifier layout configuration. Instead of having banks of sense amplifiers on either side of an memory array, as shown in FIG. 5, a number, for example, half, of the sense amplifiers in each bank are moved into the bit-line metal-to-poly contact area between two adjacent memory sub-arrays. For example, sense amplifier 30a is relocated to the area 42 between memory sub-arrays 50a, 50b which was previously dedicated to the bit-line metal-to-poly contacts. In order to ensure that all poly bit lines in each of the memory sub-arrays are coupled to a sense amplifier, each sense amplifier, for example, sense amplifier 30a, acts as a metal contact coupling a pair of complementary bit lines 52a, 52b in one memory sub-array 50a to a pair of metal lines 54a, 54b in an adjacent memory sub-array 50b respectively; the sense amplifier 30a also acts as a metal contact coupling a pair of complementary bit lines 56a, 56b in the adjacent memory sub-array 50b to a pair of metal lines 58a, 58b in the memory sub-array 50a respectively.

Figure 1:
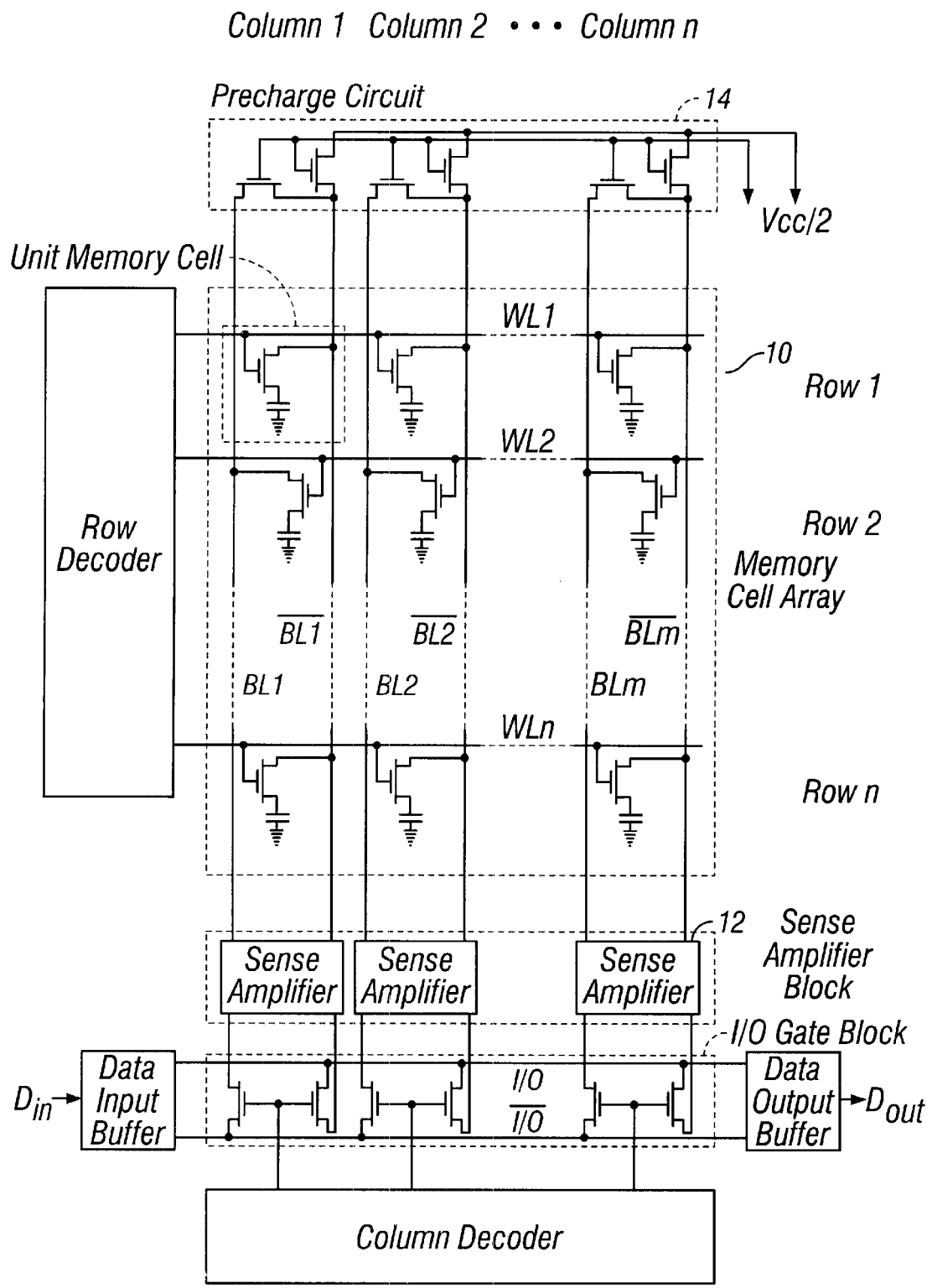
FIG. 1 is a simplified block diagram of a conventional DRAM showing an illustrative structure of a memory cell array.
Figure 2:
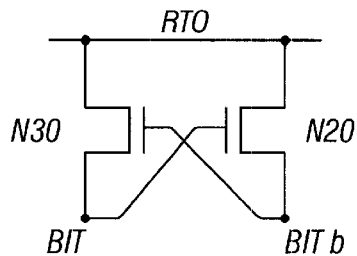
FIG. 2 is a circuit representing half of a sense amplifier commonly used in memory circuits to detect potential difference between bit line pairs.
Figure 3:
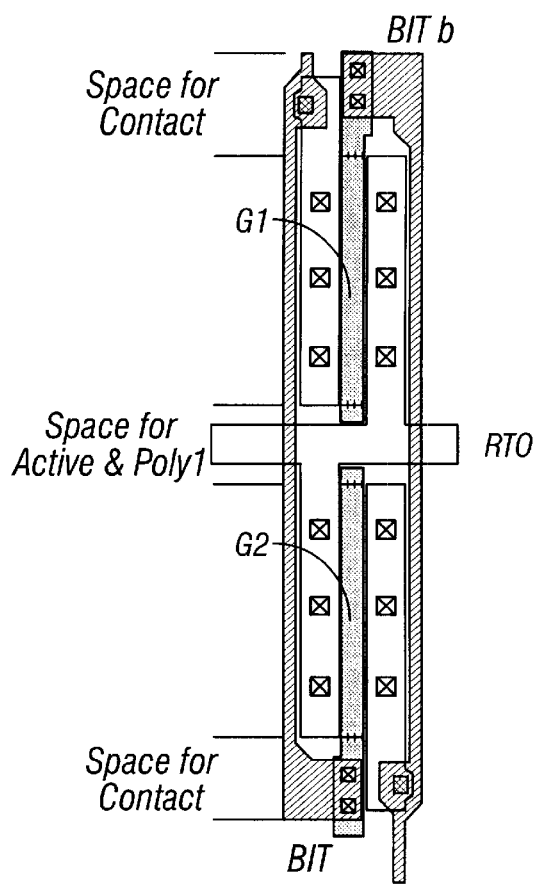
FIG. 3 shows a conventional fabrication layout for the sense amplifier circuit shown in FIG. 2 laid out in a parallel configuration.
Figure 4:
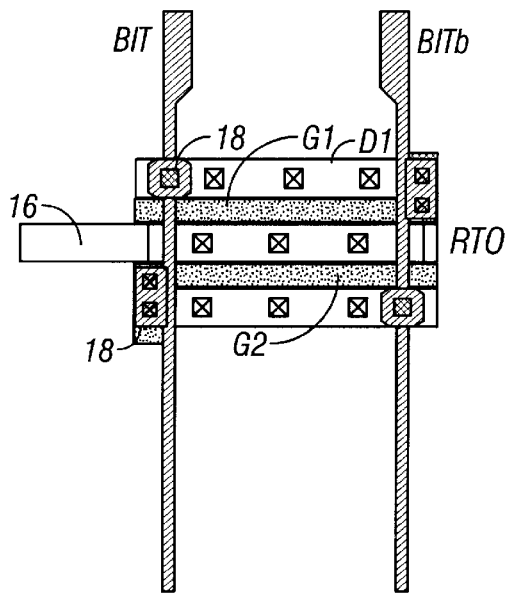
FIG. 4 shows a fabrication layout in accordance with the present invention for the sense amplifier circuit shown in FIG. 2 laid out in a right-angle configuration.

By relocating one sense amplifier 30a into the area 42 between memory sub-arrays 50a, 50b, the column pitch requirements for the sense amplifiers is relaxed. That is, according to this exemplary embodiment of the invention, the pitch for each sense amplifier is doubled (i.e., four bit lines). This is because the same amount of area is now available to accommodate a fewer number of sense amplifiers due to the relocation. Hence, the proposed configuration under the present invention allows the use of the wider but more compact right-angle layout configuration for each sense amplifier, an example of which is shown in FIG. 4. This results in a substantially more compact overall array size.

In addition, equilibration circuits are added within each sense amplifier to provide a faster precharge which, in turn, leads to faster memory access. Details of the equilibration circuits are further described below.

Figure 7:
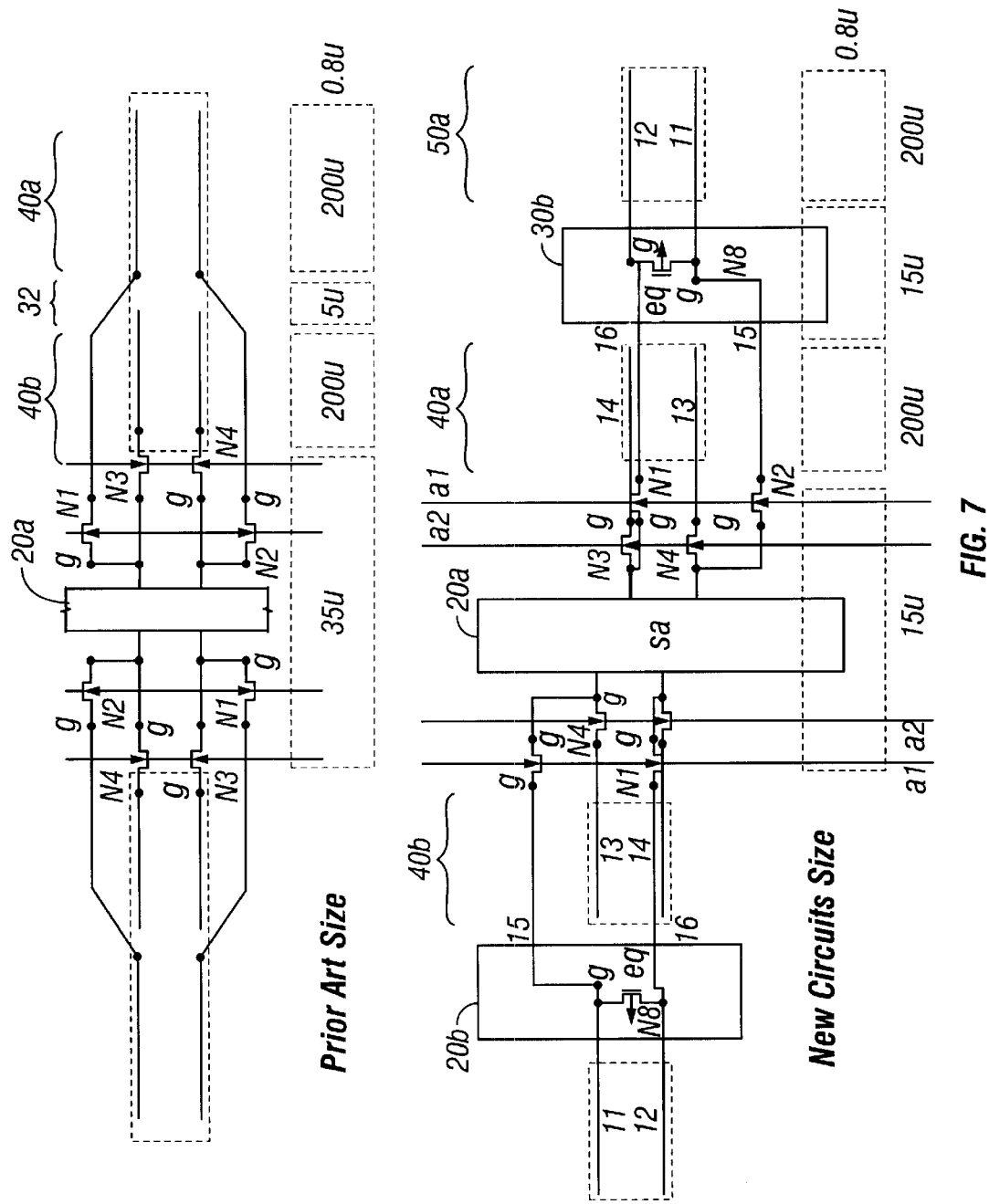
FIG. 7 is a diagram illustrating the exemplary dimensions (in microns) between the conventional divided bit-line configuration shown in FIG. 5 and the configuration proposed in accordance with the present invention as shown in FIG. 6.

FIG. 7 compares exemplary dimensions (in microns) between the conventional divided bit-line configuration shown in FIG. 5 and the memory array architecture proposed in accordance with the present invention as shown in FIG. 6. As FIG. 7 shows, the configuration proposed in accordance with the present invention achieves a saving of ten (10) microns per two banks of memory sub-arrays. The ten-micron figure is calculated as follows. Under the conventional configuration, the sense amplifier 20a and the block select circuits are collectively 35 $\mu$ wide, the two memory sub-arrays 40a, 40b are 200 $\mu$ wide each, and the bit-line metal-to-poly contact area 32 is 5 $\mu$ wide, resulting in a total width of 440 $\mu$. In contrast, under the proposed configuration, after the sense amplifier 20a has been moved to the area 42 between the two memory sub-arrays 40a, 40b, the sense amplifier 20a and the block select circuits are collectively 15 $\mu$ wide, the two memory sub-arrays 40a, 50a remain at 200 $\mu$ wide each, and the sense amplifier 30b and the block select circuits (not shown) are collectively 15 $\mu$ wide, resulting in a total width of 430 $\mu$. Considering that modern memory circuits contain hundreds of thousands of bit lines and sense amplifiers, the cumulative saving on area realized by the present invention becomes quite significant.

It is to be understood that these numbers for the various block dimensions are exemplary and are for illustrative purposes only.

Figure 8A:
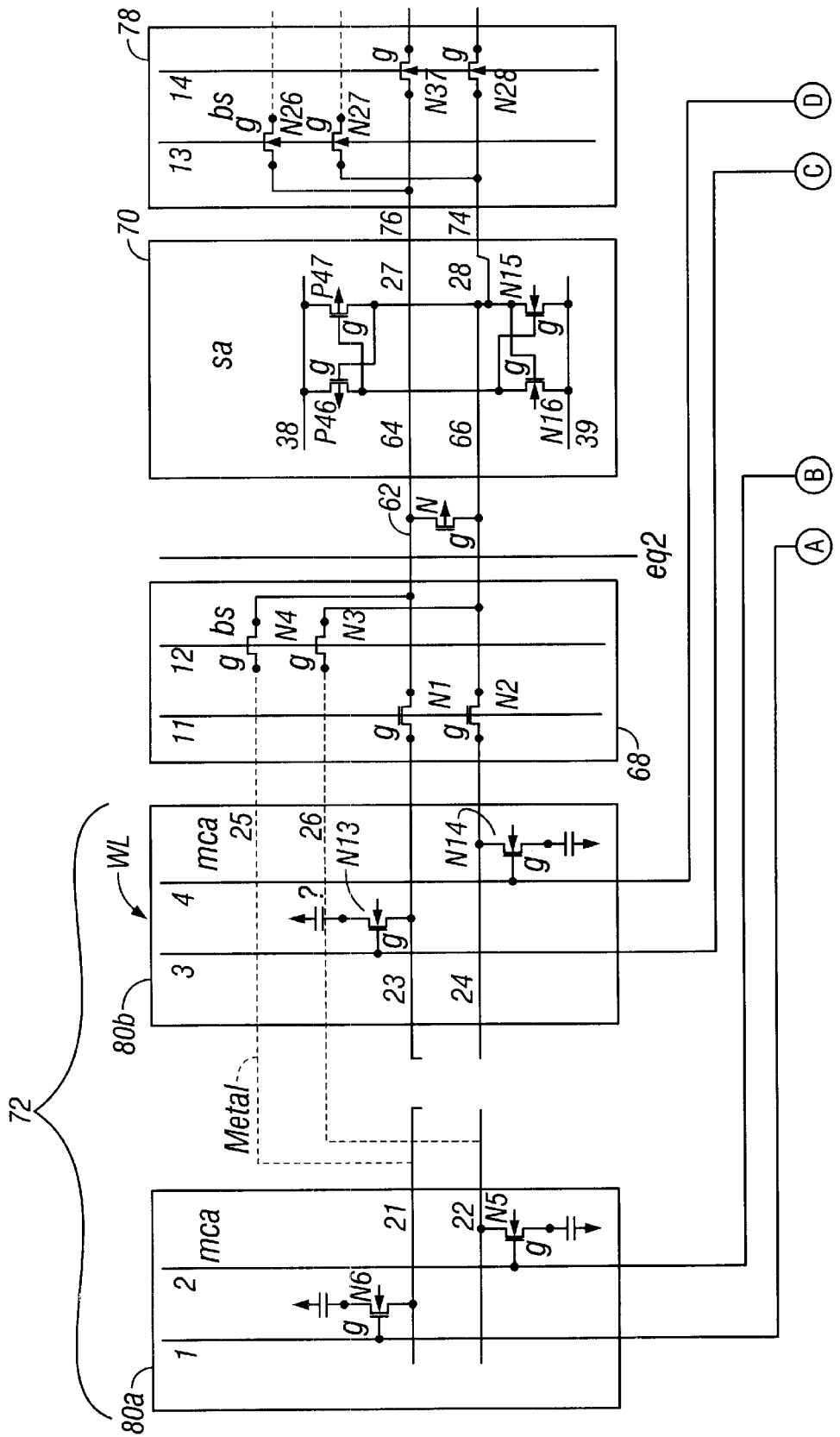
FIG. 8 is a schematic diagram showing the location of an equilibration circuit for a pair of complementary bit lines coupled to each sense amplifier in a conventional divided bit-line, shared sense amplifier circuit.
Figure 8B:
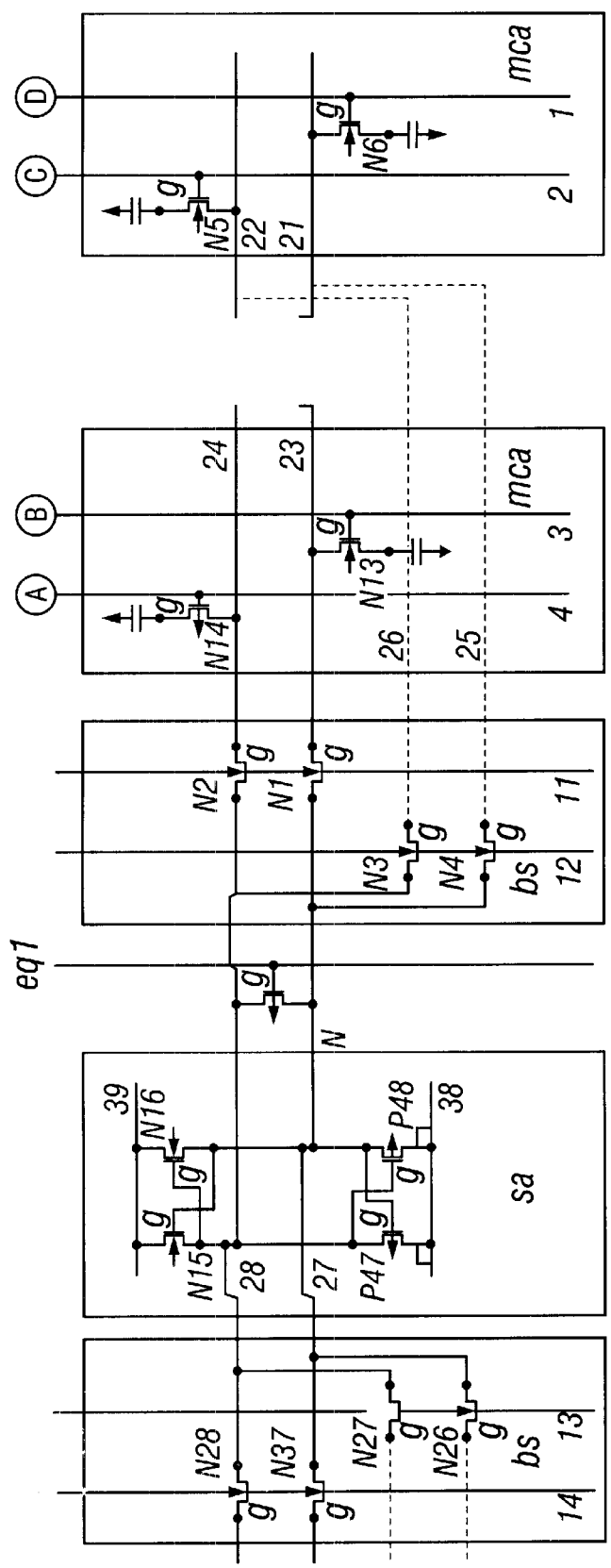

With regard to equilibration circuits, there is shown in FIG. 8 a schematic diagram showing the location of an equilibration circuit 62 for the pair of complementary bit lines 64, 66 connected to a sense amplifier 70 in a conventional divided bit-line, shared sense amplifier circuit. The equilibration circuit 62 is located between a block select circuit 68 and the sense amplifier 70. The equilibration circuit 62 is made up of a single transistor with its source and drain respectively connected to the complementary bit-line pairs 64, 66 and its gate connected to a predetermined bit-line precharge signal. At this location, the block select circuit 68 allows the equilibration circuit 62 to be shared between the complementary pairs of poly bit lines 64, 66 from the memory array 72 and metal bit lines 74, 76 from the memory array (not shown) next to block select circuit 78.

In an alternative embodiment (not shown), separate equilibration circuits are placed on the array side of the block select circuits 68 and 78 to provide a faster precharge/equilibration. Under this other configuration, two equilibration circuits 62 are needed within each array, one for each complementary pair of bit lines 64, 66 and 74, 76 going into the block select circuits 68 and 78 respectively. This is necessary because in this configuration sharing of a single equilibration circuit is not possible.

Figure 9A:
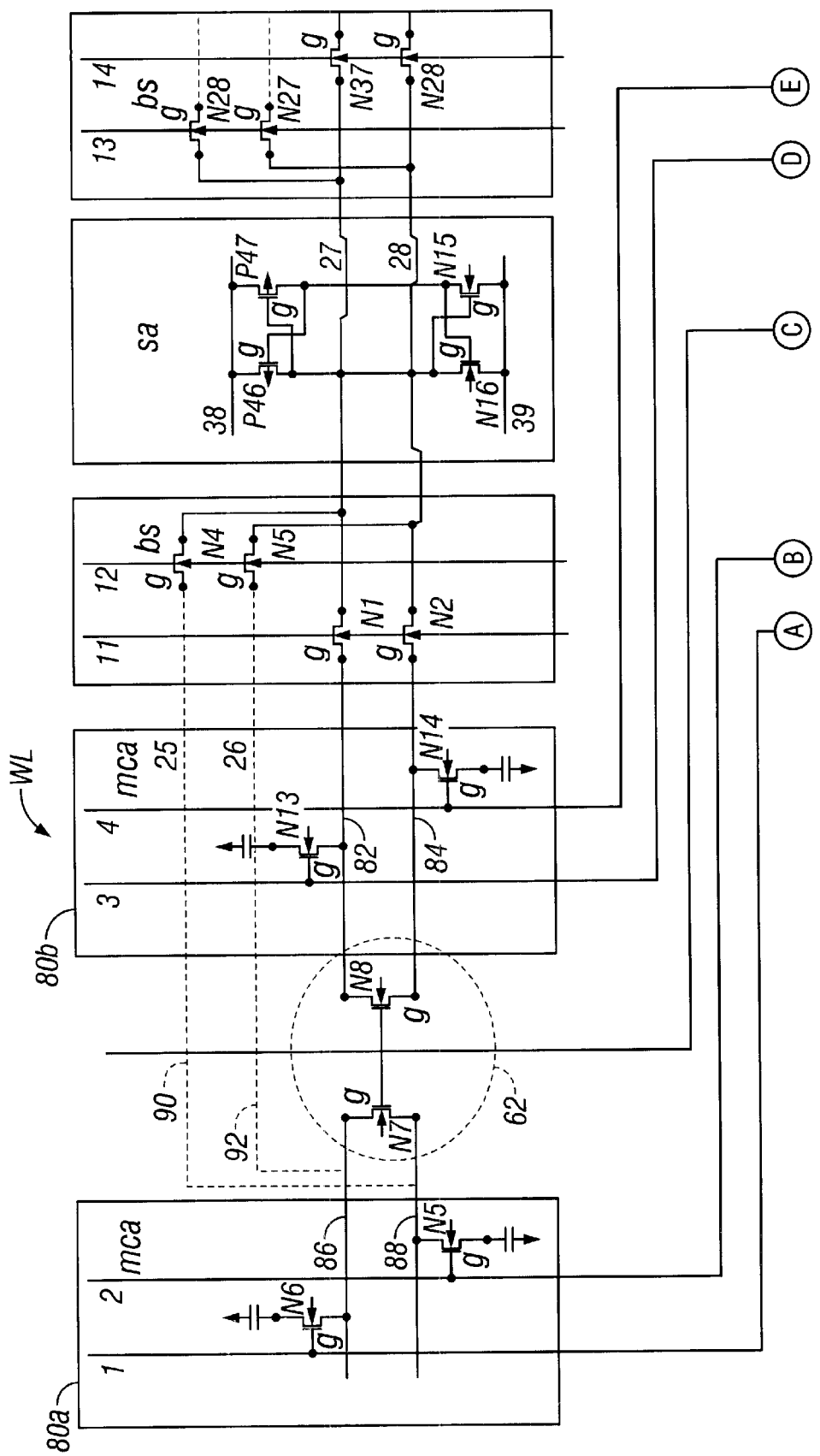
FIG. 9 is a schematic diagram showing the location of an equilibration circuit for a pair of complementary bit lines in accordance with the present invention.
Figure 9B:
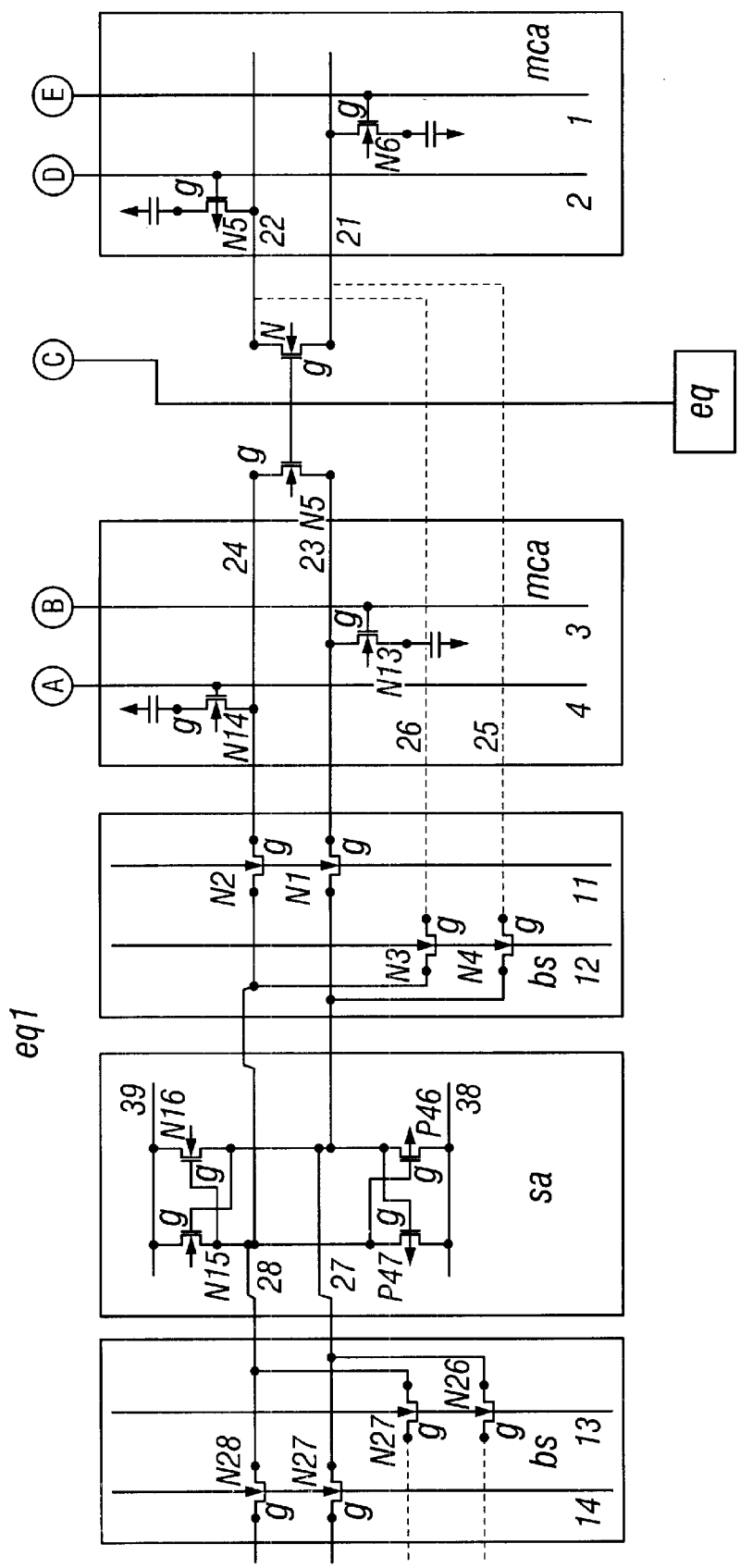

FIG. 9 is a schematic diagram showing the location of an equilibration circuit 62 for a pair of complementary bit lines in accordance with the present invention. The equilibration circuit 62 is located between two adjacent memory sub-arrays 80a, 80b. The equilibration circuit 62 under this configuration is made up of two transistors N7, N8. The gate of each transistor N7, N8 is connected to a predetermined bit-line precharge signal. The source and drain of each transistor N7, N8 are respectively connected to a pair of complementary poly bit lines 82, 84 and 86, 88. In addition, a pair of metal bit lines 90, 92 is connected to one of the two pairs of complementary poly bit lines 90, 92. Two transistors are needed in this equilibration circuit 62 because sharing of a transistor is not possible.

FIG. 6 shows the equilibration circuits 62 located between two adjacent memory sub-arrays 50a, 50b in combination with the sense amplifier 30a in accordance with the present invention. The equilibration circuit 62 similarly contains two transistors N9, N10. The source and drain of each transistor N9, N10 are each connected to both a poly bit line 52a, 52b and a metal bit line 54a, 54b, while the gate is connected to a predetermined bit-line precharge signal.

Figure 10A:
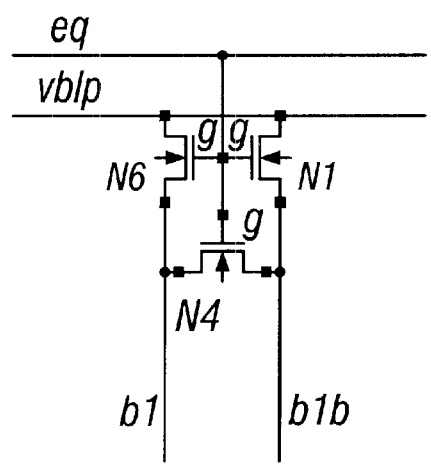
FIG. 10a is a schematic diagram showing a conventional equilibration circuit.
Figure 10B:
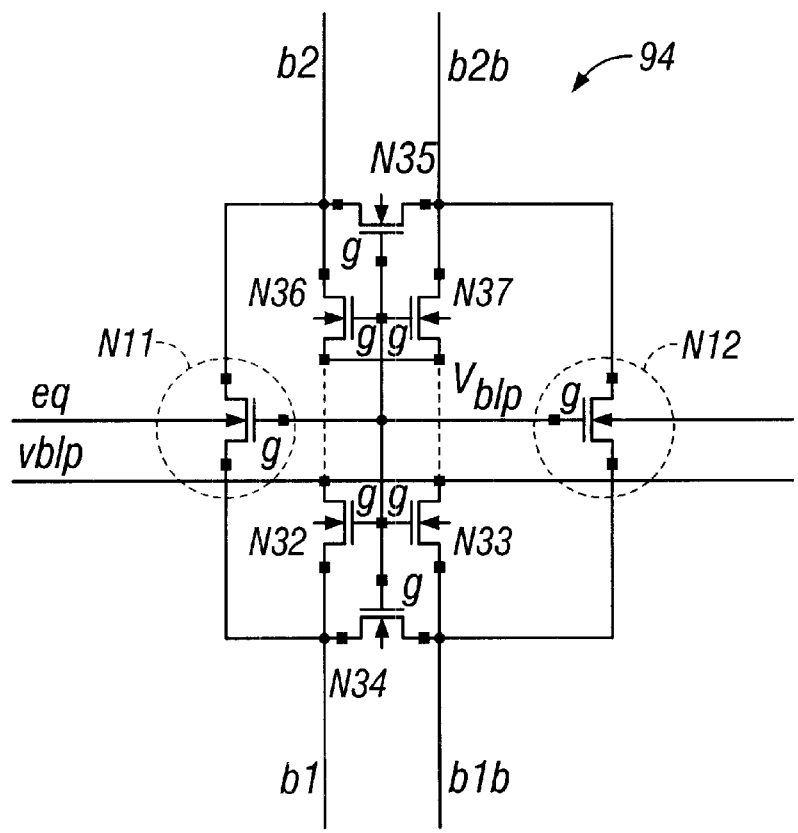
FIG. 10b is a schematic diagram showing a new equilibration circuit in accordance with the present invention.

FIGS. 10a and 10b are schematic diagrams respectively showing a conventional equilibration circuit and a new equilibration circuit in accordance with the present invention. The new equilibration circuit 94 as shown in FIG. 10b can be used in the circuit shown in FIG. 9. The new equilibration circuit 94 is constructed by using two transistors N11, N12 to connect two of the conventional equilibration circuit shown in FIG. 10a. More specifically, one transistor N11 is used to couple two bit lines b1, b2 and a second transistor N12 is used to couple the other two bit lines b1b, b2b. By coupling the bit lines together, the precharge/equilibration function can be performed more quickly and reliably. Transistors N36, N37 and N32, N33 can be added to further help pulling the bit lines to the precharge level.

FIG. 11a is a layout diagram for a conventional one-transistor equilibration circuit. As FIG. 11a shows, one gate contact 96 is required for each transistor. FIGS. 11b–e are exemplary layout diagrams for various equilibration circuits in accordance with the present invention. FIG. 11b is a layout diagram which corresponds to the equilibration circuit containing four transistors as shown in FIG. 11c. As FIG. 11b illustrates, the gate contact 98 can be shared by four transistors. FIG. 11d is another layout diagram further illustrating that one gate contact 100 can be shared by many transistors in a equilibration circuit. FIGS. 11e–f are another layout diagrams for alternative embodiments of the equilibration circuit according to the present invention.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A memory circuit comprising:
    an array of memory cells having a plurality of bit lines each coupling to a plurality of memory cells, each bit line being divided into a first and a second independent segment made of polysilicon material, said second segment making contact to a metal line at a location inside said memory array, said metal line traversing along said first segment; and
    a sense amplifier disposed at said location inside said array and configured to couple to selected bit lines.

2. A memory circuit according to claim 1, wherein said location is at a midpoint inside said array.

3. A memory circuit according to claim 1, further comprising:
    an equilibration circuit disposed at said location inside said array and configured to precharge two second segments and two metal lines to a predetermined level.

4. A memory circuit according to claim 1, wherein said sense amplifier is laid out in an integrated circuit in a right-angle configuration.

5. A memory circuit, comprising:
    a memory array having a first and a second sub-array, said memory array having a plurality of bit lines, each bit line being divided into a first and a second segment made of polysilicon material, said first segment being in said first sub-array, said second segment being in said second sub-array and coupled to a metal line at a location between said first and second sub-arrays, said metal line traversing along said first segment; and
    a sense amplifier positioned at said location to couple said second segment to said metal line and configured to couple to selected bit lines.

6. A memory circuit according to claim 5, wherein said sense amplifier is configured to couple two second segments to two metal lines respectively.

7. A memory circuit according to claim 6, wherein logic states of said two second segments are complementary.

8. A memory circuit according to claim 5, further comprising:
    an equilibration circuit positioned at said location and configured to precharge said two second segments and said two metal lines to a predetermined level.

9. A memory circuit according to claim 5, wherein said sense amplifier is laid out in an integrated circuit in a right-angle configuration.

10. A memory circuit, comprising:
    a plurality of sub-arrays of memory cells, each sub-array having a plurality of bit lines each coupling to a plurality of memory cells; and
    a sense amplifier disposed between a first and a second sub-array and configured to couple to selected bit lines and permit other bit lines to couple to a plurality of metal lines;
    wherein a first pair of bit lines from said first sub-array is respectively coupled to a first pair of metal lines via said sense amplifier; and
    wherein a second pair of bit lines from said second sub-array is respectively coupled to a second pair of metal lines via said sense amplifier.

11. A memory circuit according to claim 10, further comprising:
    a first equilibration circuit configured to precharge said first pair of bit lines and said first pair of metal lines to a predetermined level;
    wherein said first equilibration circuit is disposed between said first and said second sub-array.

12. A memory circuit according to claim 11, further comprising:
    a second equilibration circuit configured to precharge said second pair of bit lines and said second pair of metal lines to said predetermined level;
    wherein said second equilibration circuit is disposed between said first and said second sub-array.

13. A memory circuit according to claim 10, wherein said sense amplifier is laid out in an integrated circuit in a right-angle configuration.

14. A memory circuit according to claim 10, wherein said first and second sub-arrays are adjacent to each other.

15. A memory circuit according to claim 10, wherein logic states of said first pair of bit lines are complementary; and
    wherein logic states of said second pair of bit lines are complementary.

16. A memory circuit having a divided bit-line, shared sense amplifier architecture, comprising:
    a first bank and a second bank of memory sub-arrays, each memory sub-array having a plurality of bit lines extending therefrom; and
    a bank of sense amplifiers disposed between said first and second banks of memory sub-arrays and configured to be shared by said first and second banks of memory sub-arrays;
    wherein selected bit lines from said first bank of memory sub-arrays make contact with a plurality of metal lines which traverse along selected bit lines from said second bank of memory sub-array via said bank of sense amplifiers.

17. A memory circuit according to claim 16, further comprising:
    a plurality of equilibration circuits disposed between said first and second banks of memory sub-arrays and configured to precharge said selected bit lines from said first bank of memory sub-arrays and said plurality of metal lines.

18. A memory circuit, according to claim 16, wherein each of said bank of sense amplifiers is laid out in an integrated circuit in a right-angle configuration.

19. A memory circuit, according to claim 18, wherein each of said bank of sense amplifiers includes two pairs of transistors; and wherein an active area is shared by the respective sources of each pair of transistors in said right-angle configuration.

20. A memory circuit, according to claim 18, wherein contacts for connecting components of each of said bank of sense amplifiers are fitted within an active area.

21. A memory circuit having a divided bit-line, shared sense amplifier architecture, comprising:
    a plurality of banks of memory sub-arrays, each sub-array having a plurality of bit lines; and
    a plurality of banks of sense amplifiers;
    wherein any two adjacent banks of memory sub-arrays share at least one bank of sense amplifiers; and
    wherein a first number of selected bit lines from a first bank of sub-array make contact with a plurality of metal lines traversing along a second number of selected bit lines from a second bank of sub-array adjacent to said first bank of sub-array.

22. A memory circuit according to claim 21, wherein each of said plurality of banks of sense amplifiers is laid out in an integrated circuit in a right-angle configuration.

23. A memory circuit according to claim 21, further comprising:
    a plurality of equilibration circuits configured to couple said first number of selected bit lines with said plurality of metal lines;
    wherein said plurality of equilibration circuits are disposed between said first and second bank of sub-arrays.

24. An improved memory circuit having a divided bit-line, shared sense amplifier architecture, said memory circuit having a first and second banks of sense amplifiers, and a first and second banks of memory sub-arrays disposed between said first and second banks of sense amplifiers, each memory sub-array having a plurality of bit lines, a first number of selected bit lines from said first bank of memory sub-array making contact with a plurality of metal lines traversing along a second number of selected bit lines from said second bank of memory sub-arrays via a contact area located between said first and second banks of memory sub-arrays, the improvement comprising:
    a third bank of sense amplifiers disposed between said first and second banks of memory sub-arrays at a location previously occupied by said contact area and configured to be shared by said first and second banks of memory sub-arrays;
    wherein at least one of said first bank of sense amplifiers is repositioned to form said third bank of sense amplifiers.

25. An improved memory circuit according to claim 24, wherein half of said first bank of sense amplifiers are repositioned to form said third bank of sense amplifiers.

26. An improved memory circuit according to claim 24, wherein said first number of selected bit lines from said first bank of memory sub-array make contact with said plurality of metal lines at said location previously occupied by said contact area.

27. An improved memory circuit according to claim 24, wherein each of said banks of sense amplifiers is laid out in an integrated circuit in a right-angle configuration.

28. An improved memory circuit having a divided bit-line, shared sense amplifier architecture, comprising:
    a first and a second memory sub-arrays positioned adjacent to one another;
    a sense amplifier disposed at a location between said first and second memory sub-arrays and configured to be shared by said first and second memory sub-arrays; and
    an equilibration circuit disposed at said location and configured to precharge selected bit lines from said first and second memory sub-arrays and a plurality of metal lines.

29. An improved memory circuit, according to claim 28, wherein said equilibration circuit further includes a first and a second transistors;
    wherein the gate of said first transistor is coupled to the gate of said second transistor; wherein a first pair of bit lines extending from said first memory sub-array are coupled respectively to the source and drain of said first transistor;
    wherein a second pair of bit lines extending from said second memory sub-array are coupled respectively to the source and drain of said second transistor; and
    wherein a pair of metal bit lines extending from said second memory sub-array are coupled respectively to said first pair of bit lines.

30. An improved memory circuit according to claim 28, wherein said equilibration circuit further comprises:
    a first circuit having a first, second and third transistors; wherein the drain of said first transistor is coupled to the drain of said second transistor; wherein the source of said first transistor is coupled to the drain of said third transistor;
    a second circuit having a fourth, fifth and sixth transistors; wherein the drain of said fourth transistor is coupled to the drain of said fifth transistor; wherein the source of said fourth transistor is coupled to the drain of said sixth transistor;
    a first switch coupling the respective drains of said second and fifth transistors; and
    a second switch coupling the respective drains of said third and sixth transistors;
    wherein all the respective gates of said first, second, third, fourth, fifth and sixth transistors and said first and second switches are coupled to an equilibration trigger signal; and
    wherein the respective sources of said second, third, fifth and sixth transistors are coupled to a predetermined bit-line equilibration signal.

31. An improved memory circuit, according to claim 30, wherein said first switch is a first coupling transistor; wherein said second switch is a second coupling transistor; and wherein the respective gates of said first and second coupling transistors are coupled to said equilibration trigger signal.

32. An improved memory circuit, according to claim 28, wherein said equilibration circuit has a layout structure comprising:
    an active area divided into a first, second, third and fourth quadrants;
    a gate contact extending along a median of said active area;
    a first bit line coupled to said first quadrant;
    a second bit line coupled to said second quadrant;
    a third bit line coupled to said third quadrant;
    a fourth bit line coupled to said fourth quadrant; and
    an equilibration trigger signal coupled to said gate contact.

33. An improved memory circuit, according to claim 32, wherein said first bit line carries a first signal, said second bit line carries a second signal, said third bit line carries a third signal, and said fourth bit line carries a fourth signal; and wherein said first signal is a complement of said fourth signal and said second signal is a complement of said third signal.

34. An improved memory circuit, according to claim 32, wherein said layout structure is repeated to form a second layout structure; wherein said layout structure is coupled to said second layout structure via their respective gate contacts.

35. An improved memory circuit, according to claim 28, wherein said equilibration circuit has a layout structure comprising:

an active area;

a Y-shape gate contact placed on top of said active area thereby dividing said active area into a first, second and third regions;

a first bit line coupled to said first region;

a second bit line coupled to said second region; and a signal line coupled to said third region.

36. An improved memory circuit, according to claim 35, wherein said first bit line carries a first signal and said second bit line carries a second signal; wherein said first signal is a complement of said second signal; and wherein said signal line carries a predetermined bit-line voltage.

* * * * *